United States Patent [19]

Foell et al.

[11] Patent Number: 4,874,484

[45] Date of Patent: Oct. 17, 1989

[54] ETCHING METHOD FOR GENERATING APERTURED OPENINGS OR TRENCHES IN LAYERS OR SUBSTRATES COMPOSED OF N-DOPED SILICON

[75] Inventors: Helmut Foell; Volker Lehmann, both of Munich, Fed. Rep. of Germany

[73] Assignee: Siemens Aktiengesellschaft, Munich, Fed. Rep. of Germany

[21] Appl. No.: 193,760

[22] Filed: May 13, 1988

[30] Foreign Application Priority Data

May 27, 1987 [DE] Fed. Rep. of Germany ....... 3717851

[51] Int. Cl.[4] .............................................. C25F 3/12
[52] U.S. Cl. ............................ 204/129.3; 204/129.55; 204/129.65; 204/129.35; 204/129.75
[58] Field of Search ........... 204/129.3, 129.35, 129.65, 204/129.55, 129.75

[56] References Cited

U.S. PATENT DOCUMENTS

| 3,471,922 | 10/1969 | Legat et el. ............... 29/580 |
| 3,661,741 | 5/1972 | Meek ..................... 204/129.3 X |
| 3,801,390 | 4/1974 | Lepselter et al. ........... 156/8 |
| 3,846,167 | 11/1974 | Higuchi et al. ............. 204/129.3 X |
| 3,962,052 | 6/1976 | Abbas et al. ............... 204/129.3 |
| 3,962,713 | 6/1976 | Kendall et al. ............. 357/14 |
| 4,180,439 | 12/1979 | Deines et al. ............... 204/129.3 X |
| 4,482,443 | 11/1984 | Bacon et al. ............... 204/129.3 |
| 4,628,591 | 12/1986 | Zorinsky et al. ............ 204/129.3 X |
| 4,689,125 | 8/1987 | Burrus, Jr. et al. ......... 204/129.75 X |

FOREIGN PATENT DOCUMENTS

| 18556 | 11/1980 | European Pat. Off. . |
| 45446 | 2/1982 | European Pat. Off. . |
| 106477 | 4/1984 | European Pat. Off. . |
| 178387 | 4/1986 | European Pat. Off. . |
| 1421973 | 11/1968 | Fed. Rep. of Germany . |
| 1901388 | 9/1969 | Fed. Rep. of Germany . |
| 1548079 | 11/1968 | France . |
| 2339953 | 8/1977 | France . |
| 1487849 | 10/1977 | United Kingdom . |

OTHER PUBLICATIONS

Nicky Chau-Chun Lu et al., *A Substrate-Plate Trench-Capacitor (SPT) Memory Cell for Dynamic RAM's*, IEEE Journal of Solid-State Circuits, vol. SC-21 No. 5, Oct. 1986.

T. Morie et al., *Depletion Trench Capacitor Technology for Megabit Level MOS dRAM*, IEEE Electron Device Letters, vol. EDL-4, No. 11, Nov. 1983, pp. 411-414.

H. J. Hoffmann et al., *Photo-Enhanced Etching of n-Si*, Appl. Phys. A 33, pp. 243-245 (1984).

Primary Examiner—Donald R. Valentine
Attorney, Agent, or Firm—Hill, Van Santen, Steadman & Simpson

[57] ABSTRACT

The present invention provides the production of apertured openings or trenches in layers or substrates composed of n-doped silicon proceeding in an electrolytic way, whereby the silicon is connected as a positively polarized electrode of an electrolysis cell containing an agent that contains hydrofluoric acid. Hole structures having highly variable cross-section can be reproducibly manufactured with the method of the invention and holes can be localized by prescribing nuclei. The invention can be used in the manufacture of trench cells in memory modules, insulating trenches in LSI semiconductor circuits, large-area capacitors (varicaps), and in contacting more deeply disposed layers in disconnectable and voltage-controlled thyristors.

9 Claims, 3 Drawing Sheets

ETCHING METHOD FOR GENERATING APERTURED OPENINGS OR TRENCHES IN LAYERS OR SUBSTRATES COMPOSED OF N-DOPED SILICON

BACKGROUND OF THE INVENTION

The present invention relates generally to the manufacture of semiconductor components. More particularly, the present invention is directed to a method for generating apertured openings or trenches in layers or substrates composed of n-silicon as used in the manufacture of semiconductor components, particularly LSI semiconductor circuits, through masked etching.

One of the most important materials in the creation of microelectronic components is silicon. As such, silicon requires more and more designational and specific methods for surface structuring. One of the more technically difficult areas in the manufacture of semiconductor components is the generation of trenches, or, respectively, holes in the silicon surface.

Heretofore, chemical etching methods or plasma etching methods were typically used for generating, in the silicon surface, hole-shaped or trench-shaped structures. When these methods are utilized, the following difficulties arise:

(a) using isotropic chemical etching (acidic) results in under-etchings that greatly limit the possible etching geometries - this is illustrated in FIG. 1, the under etchings being represented by 10;

(b) when anisotropic chemical etching (alkaline) is used, the plurality of realizable etching geometries is highly limited by the crystal faces - see FIG. 2, wherein the crystal faces are represented by 100 and 111; and (c) in plasma etching, as may be derived, for example, from a report by Morie et al in IEEE Electron Device Letters, Volume EDL-4, No. 11 (November 1983), pages 411 through 414, for the creation of the trench cells of Mbit memories dimensions below 1 um as well as depth-to-width ratios T/B greater than 10 in holes can only be achieved with great difficulty (see FIG. 3). The rectangular cross-section in Morie is highly dependent on the gas pressure of the reaction gas (tri-fluoro bromomethane).

Accordingly, there is a need for an improved method for generating openings or trenches in silicon surfaces to manufacture semiconductor components.

SUMMARY OF THE INVENTION

The present invention provides an improved method for generating holes and trenches in silicon substrates for the manufacture of semiconductor components. To this end, the present invention provides a method that manufactures hole geometries and trenches in a controlled manner with a simple etching method wherein both holes and trenches in silicon are generated with arbitrary cross-sections for microelectronics (diameter less than 1 um and a depth of 10 um) as well as for power component electronics. Further, pursuant to the method of the present invention, it should also be possible to generate fine trenches (perforations) for receiving dopants in the silicon.

As stated above, the present invention provides a method for generating apertured openings or trenches in layers or substrates of n-silicon, as used in the manufacture of semiconductor components through mask etching. To this end, the etching is carried out through an electrolytic etching in an electrolyte containing hydrofluoric acid upon application of a potential that is either constant or chronologically varying. The layer or the substrate composed of silicon is connected as a positively polarized electrode of an electrolysis cell.

In an embodiment, the electrolysis is injected by illuminating the silicon member proceeding from its back side. In a further embodiment, the illumination is maintained in a constant or chronologically varied manner in order to control the etching current on the basis of the formation of minority charge carriers.

In an embodiment, a chemical etching is also performed before and/or after the electrolytic etching. The chemical etching is preferably performed in a caustic potash solution. In an embodiment, a wetting agent is added. In an embodiment, the wetting agent is formaldahyde.

In an embodiment, in addition to the electrolyte contact to be etched, the silicon member can also additionally include an ohmic contact or a further electrolyte contact (contact for the majority charge carriers).

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

The present invention provides a method for generating apertured openings or trenches in layers or substrates composed of n-silicon, as used in the manufacture of semiconductor components. The method proceeds on the basis of an electrolytic etching carried out in an electrolyte containing hydrofluoric acid, upon the application of a constant or chronologically varying potential. The layer or substrate composed of silicon is connected as a positively polarized electrode of an electrolysis cell. By way of example, the method of the present invention shall be set forth in more detail with reference to the electrolytic etching of a hole in an n-doped silicon.

Figure 4:
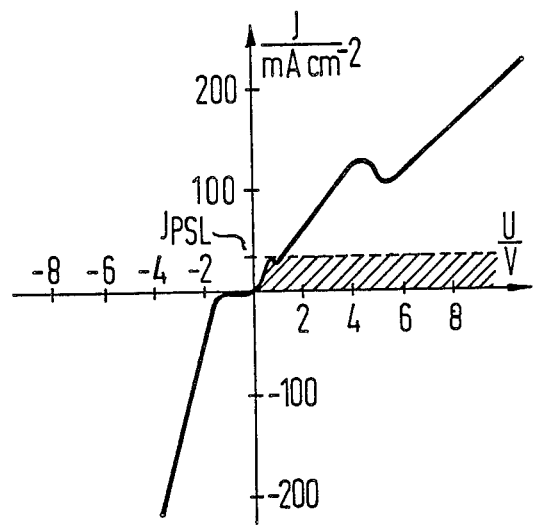
FIG. 4 illustrates the I-V characteristics of a hydrofluoric acid electrolyte n-silicon contact.

Referring to FIG. 4, the fundamental I-U characteristic of a hydrofluoric acid electrolyte n-silicon contact is illustrated. Proceeding in the shaded area as an anodic electrode reaction is the divalent dissolving ($I < I_{PSL}$) (as used herein, PSL means porous silicon layer; this layer is formed in the anodic region in hydrofluoric acid on p-silicon and n-silicon) of the silicon without formation of an electropolishing surface layer as occurs in the tetravalent dissolution region ($I > I_{PSL}$), i.e. the entire, applied voltage drops off over the space charge zone (RLZ). However, an electrical current only flows when minority charge carriers (holes h+) are present. These can be generated by illumination; the current is thus a function of the incident light.

Figure 5:
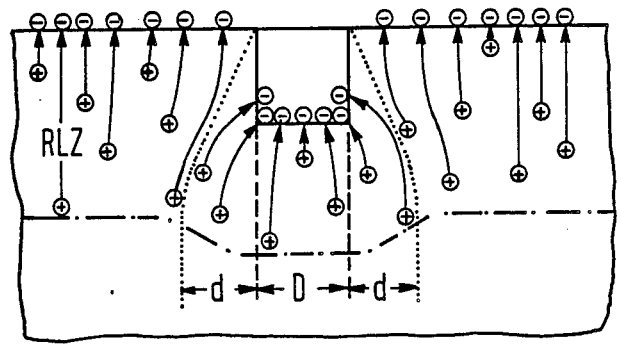
FIG. 5 illustrates a schematic of the etching of a hole in the substrate.

These specific properties of the nSi electrode, given current densities that are not too great, leads to the build up of small deviations from the ideally smooth surface build up, i.e. a minimal hole or, respectively, an etched trench, that bends the electrical field of the space charge zone in precisely such a fashion that all near h+ are collected by the hole. Accordingly, the etching is intensified at the floor of the hole. As can be seen from FIG. 5, the hole having a width D collects charge carriers from the region D+2d. After a given time, a system of fine, tightly adjacent holes forms on the basis of the described process. This microscopic honeycomb surface absorbs light to an extremely high degree, i.e., it is macroscopically intense black.

The small deviations can be prescribed by a suitable mask and a pre-etching with, for example, caustic potash solution and, thus, the holes can be localized. Due to the specific shape of the space charge zone, an individual hole will branch out and thus form a tree-like hole structure, whereas a uniform pattern of holes leads to a strictly vertical growth direction due to mutual influencing. The shape and dimension of the holes is highly variable and is dependent on the following parameters:

1. Because of its influence on the space charge zone, the hole arrangement mask has a highly defining effect on the geometry of the holes - branching or linear.

2. The pre-etching with caustic potash solution only improves the small deviations from the ideally smooth surface (nucleus) prescribed by the mask and thus acts only on the shape of the upper edge of the hole.

3. The potential applied between the silicon and reference electrode (voltage) determines the electrical field in the space charge zone and, thus, the wall roughness of the holes (given voltages in the region of the punch-through field strength, the holes are pointed and narrow and the whole wall is greatly disrupted by fine channels (point discharges)).

4. The etching current through the specimen surface is a function of the incident light; it determines the hole width and also influences the punch-through mechanism.

5. The hole depth is approximately proportional to the etching duration.

6. The doping of the substrate determines the expanse and the field in the space charge zone. Generally, it can be said as a scaling rule that the geometrical dimensions of the holes are enlarged by a factor of 2 given a quadrupling of the doping.

7. The influences of the hydrofluoric concentration and of the temperature, although they have not yet been studied in depth, are estimated to be rather slight.

8. An after-etching, for example in caustic potash solution, serves, first, to remove the porous silicon layer (PSL in FIG. 4) forming process-conditioned or, second, in order to connect finely structured channels to form rougher structures, for example, trenches.

Figure 6:
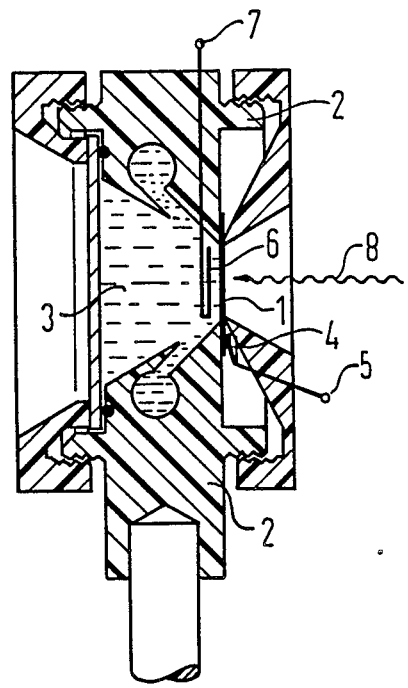
FIG. 6 illustrates schematically the etching process in an electrolysis cell.

Referring to FIG. 6, a schematic of the etching process in an electrolysis cell wherein a specimen holder for implementation of the electrolysis etching is illustrated in cross-section. A silicon crystal wafer 1, composed of n-doped silicon, in whose surface provided with a masking layer the structures (holes or trenches) are to be generated is clamped in a specimen holder 2. The specimen holder 2 is constructed from Teflon that is constructed so that it contains the electrolyte 3 composed of a hydrofluoric acid solution securely in its interior. The silicon crystal wafer 1 is connected to a positive pole 5 of a voltage source (not shown) via an ohmic contact 4. The cooperating electrode 6 (negative pole 7=cathode) is composed of a material that is resistant to hydrofluoric acid, for example platinum.

In order to achieve the required current density, the silicon crystal wafer 1 is illuminated with light of a suitable intensity (see wavy arrow 8) proceeding from the backside. Under these conditions, anodic dissolution at the surface of the silicon crystal wafer 1 not covered with the masking layer (not shown) proceeds given an applied voltage. The depth of the etched trenches or holes is predominately controlled by the etching time.

By way of example, and not limitation, examples of embodiments of the method of the present invention will now be given.

First Exemplary Embodiment

Figure 7:
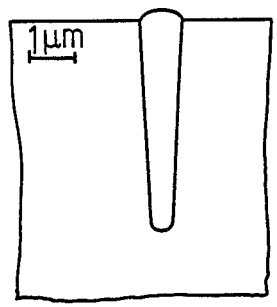
FIGS. 7-11 illustrate cross-sections of the structure obtained after the etching.

In this example, the method produces holes in memory modules such as, for example, trench cells (see FIG. 7).

Figure 1:
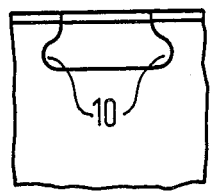
FIG. 1 illustrates a substrate that has been isotropically etched.
Figure 2:
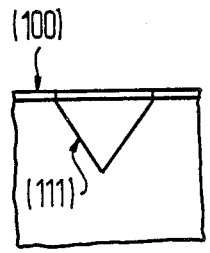
FIG. 2 illustrates a substrate that has been anistropically etched.
Figure 3:
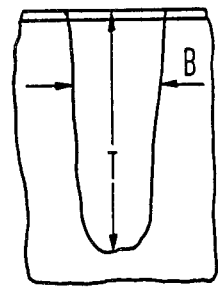
FIG. 3 illustrates a substrate that has been etched through plasma etching.

Holes having a diameter of 1 um and a depth of 10 um are produced in n-silicon pursuant to the method of the present invention. These holes function to accept the varactor or the varactor and selection transistor of a DRAM (dynamic random access memory). To create the holes, a mask composed, for example, of silicon nitride is applied in conventional technique to an n-doped silicon crystal wafer in a first step. The arrangement of the holes established by the mask is pre-etched for 10 minutes with an alkaline etchant, for example 10% caustic potash solution (see FIG. 2). The silicon crystal wafer is then clamped in an arrangement shown in FIG. 6 or in an arrangement modified for production purposes.

Electrolytic etching in a hydrofluoric acid solution (2.5% by weight) that is laced with a wetting agent based on a formaldehyde (Mirsaol$^R$, 3 drops per liter) then proceeds under the following parameters (the parameters cited in the following exemplary embodiments are only rough guidelines that must be optimized and chronologically varied dependent upon the application):

The potential between reference electrode and ohmic specimen contact is set at U=1V (positive pole at specimen).

The etching current per hole is 0.1 nA set by illuminating the backside with light, for example, light having a wavelength of 800 nm (current I is chronologically constant or decreasing dependent on the hole shape to be produced).

The duration of the etching t is 20 minutes. The ndoped substrate comprises a doping $N_n$ of 1 Ohm cm and an orientation in (100) - direction.

The etching proceeds at room temperature.

An after-etching for 10 minutes in 1% caustic potash solution proceeds as the last step for removing the porous silicon layer (referenced PSL in FIG. 4) that forms during etching.

Second Exemplary Embodiment

Figure 8:
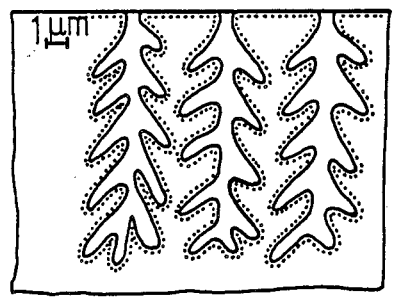

Pursuant to the method of this example, deep, vertical dopings (potentially through the entire thickness of the silicon crystal wafer) are produced given a slight horizontal doping depth (see FIG. 8), as well as the manufacture of large-area capacitors or pn-junctions (for example, for controllable, high capacitance capacitors (Varicaps)) in small volumes.

The pre-treatment and after-treatment in caustic potash solution ensues as set forth in the first exemplary embodiment; analogous values apply for the concentration of the electrolyte and for the illumination.

The potential between reference electrode and ohmic specimen contact is set at U=2V, the etching current I is set at 1nA, the etching time t is set at 100 minutes, and the doping is set at a range from approximately 0.1 to about 1 Ohm cm.

The subsequent doping (see dot-dash line in FIG. 8) proceeds via conventional technique.

Third Exemplary Embodiment

Figure 9:
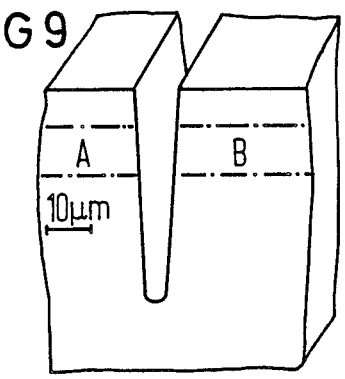

Pursuant to the method of this example, deep, narrow trenches for electrical insulation of regions A and B (see FIG. 9) in a silicon substrate are produced.

The same parameters as set forth in exemplary embodiments 1 and 2 are used, with the exception that:

The potential between the reference electrode and ohmic specimen contact is set at U=20V, the etching current I is set at 1 nA, and the etching time t is set at 100 minutes. The doping $N_n$ lies between approximately 1 to about 100 Ohm cm.

The after-etching in caustic potash solution is intensified in order to connect the individual holes prescribed by the mask to form a closed trench. This proceeds either on the basis of a longer etching time and/or on the basis of higher concentrations and/or on the basis of a higher temperature of the KOH solution.

Fourth Exemplary Embodiment

Figure 10:
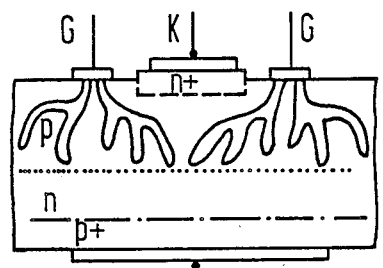

Pursuant to the method of the present invention, in this example, contacting of more deeply disposed layers is created. For example, for the fast elimination of charge carriers in disconnectable (GTO=gate turn off) thyristors (see FIG. 10).

The same parameters as set forth in the exemplary embodiments 1 through 3 are utilized except that:

The potential between the reference electrode and ohmic specimen contact is set at U=2V, the etching current I is set at approximately 1 to about 100 nA, and the etching time t is set at 100 minutes. The doping $N_n$ lies between approximately 1 to about 100 Ohm cm. Minority charge carriers present in the pregion are removed by the etched and potentially metallized channels.

The letters A, K, and G indicate the anode, cathode, and the gate of the thyristors, respectively.

Fifth Exemplary Embodiment

Figure 11:
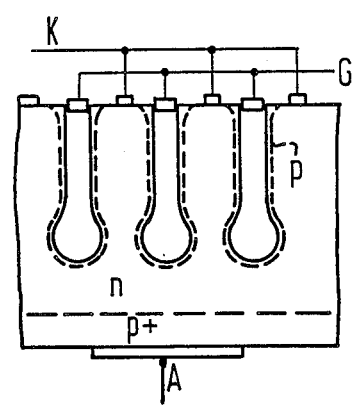

In the method of this example, voltage-controlled thyristors (see FIG. 11) are produced.

The same parameters as set forth in exemplary embodiments 1 through 4 were utilized with the exception that: the potential between the reference electrode and ohmic contact is set at U=2V, the etching time is set at 100 minutes, and the doping $N_n$ is set between approximately 10 to about 100 Ohm cm. After two/thirds of the etching time, a boost of the etching current I in the range of from 1 to about 100 nA proceeds by a factor of 2 through 10, whereby hole widening is achieved.

The current between the anode A and cathode K of the component is controlled by the voltage-dependent enlargement of the space charge zone around the holes. G references the gate terminals.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for generating apertured openings of trenches in substrates composed of n-silicon, as used in the manufacture of semiconductor components, especially LSI semiconductor circuits, through masked etching, wherein an electrolytic etching is carried out in an electrolyte containing hydrofluoric acid, through the application of a constant or chronologically varying potential, the silicon substrate being connected as a positively polarized electrode of an electrolysis cell, the electrolysis being injected by illuminating the silicon member proceeding from a backside and a structured silicon nitride layer is used as an etching mask.

2. A method for generating apertured openings of trenches in substrates composed of n-silicon, as used in the manufacture of semiconductor components, especially LSI semiconductor circuits, through masked etching, wherein an electrolytic etching is carried out in an electrolyte containing hydrofluoric acid, through the application of a constant or chronologically varying potential, the silicon substrate being connected as a positively polarized electrode of an electrolysis cell, the electrolysis being injected by illuminating the silicon member proceeding from a backside and a chemical etching is also performed before and/or after the electrolytic etching.

3. The method of claim 2 wherein the chemical etching is carried out in a caustic solution.

4. A method for generating apertured openings of trenches in substrates composed of n-silicon, as used in the manufacture of semiconductor components, especially LSI semiconductor circuits, through masked etching, wherein an electrolytic etching is carried out in an electrolyte containing hydrofluoric acid, through the application of a constant or chronologically varying potential, the silicon substrate being connected as a positively polarized electrode of an electrolysis cell, the electrolysis being injected by illuminating the silicon member proceeding from a backside and a wetting agent is added to the electrolyte.

5. The method of claim 4 wherein the wetting agent is based on formaldahyde.

6. A method for generating apertured openings of trenches in substrates composed of n-silicon, as used in the manufacture of semiconductor components, especially LSI semiconductor circuits, through masked etching, wherein an electrolytic etching is carried out in an electrolyte containing hydrofluoric acid, through the application of a constant or chronologically varying potential, the silicon substrate being connected as a positively polarized electrode of an electrolysis cell, the electrolysis being injected by illuminating the silicon member proceeding from a backside and a wet etching is carried out in a 1 to about 10 weight percent caustic potash solution with an etching time of 10 minutes.

7. A method for generating apertured openings of trenches in substrates composed of n-silicon, as used in the manufacture of semiconductor components, especially LSI semiconductor circuits, through masked etching, wherein an electrolytic etching is carried out in an electrolyte containing hydrofluoric acid, through the application of a constant or chronologically varying potential, the silicon substrate being connected as a positively polarized electrode of an electrolysis cell, the electrolysis being injected by illuminating the silicon member proceeding from a backside and a pre-etching is carried out in a 10 weight percent caustic potash solution with an etching time of 10 minutes.

8. A method for manufacturing semiconductor components including the steps of generating controlled hole geometries and trenches in a silicon substrate through masked etching by using an electrolytic etching in an electrolyte containing hydrofluoric acid, with a constant or chronologically varying potential, and using a chemical etching before the electrolytic etching.

9. The method of claim 8 including the step of injecting the electrolysis by illuminating the silicon substrate.

* * * * *